US008641821B2

(12) United States Patent
Katou et al.

(10) Patent No.: US 8,641,821 B2
(45) Date of Patent: Feb. 4, 2014

(54) APPARATUS FOR MANUFACTURING ALUMINUM NITRIDE SINGLE CRYSTAL, METHOD FOR MANUFACTURING ALUMINUM NITRIDE SINGLE CRYSTAL, AND ALUMINUM NITRIDE SINGLE CRYSTAL

(75) Inventors: Tomohisa Katou, Tsukuba (JP); Ichirou Nagai, Tsukuba (JP); Tomonori Miura, Tsukuba (JP); Hiroyuki Kamata, Sakura (JP)

(73) Assignees: National Institute of Advanced Industrial Science and Technology, Tokyo (JP); Fujikura Ltd., Tokyo (JP)

( * ) Notice: Subject to any disclaimer, the term of this patent is extended or adjusted under 35 U.S.C. 154(b) by 0 days.

(21) Appl. No.: 13/278,839

(22) Filed: Oct. 21, 2011

(65) Prior Publication Data
US 2012/0039789 A1     Feb. 16, 2012

Related U.S. Application Data

(63) Continuation of application No. PCT/JP2010/002928, filed on Apr. 22, 2010.

(30) Foreign Application Priority Data

Apr. 24, 2009   (JP) .................................. 2009-106689

(51) Int. Cl.
  *C01B 21/072*   (2006.01)
  *A23G 3/24*   (2006.01)
  *C30B 23/00*   (2006.01)
  *C30B 11/00*   (2006.01)

(52) U.S. Cl.
  USPC ................ 117/206; 117/84; 118/726; 423/42

(58) Field of Classification Search
  None
  See application file for complete search history.

(56) References Cited

U.S. PATENT DOCUMENTS 4,382,837 A * 5/1983 Rutz ................................ 117/99
5,858,086 A * 1/1999 Hunter ............................ 117/84
(Continued)

FOREIGN PATENT DOCUMENTS

EP         206514 A  * 12/1986
JP    2007-145679 A      6/2007
(Continued)

OTHER PUBLICATIONS

E. N. Mokhov, et al., "Sublimation growth of AlN bulk crystals in Ta crucibles", Journal of Crystal Growth, 2005, pp. 93-100, vol. 281.

(Continued)

*Primary Examiner* — Guinever Gregorio
(74) *Attorney, Agent, or Firm* — Sughrue Mion, PLLC

(57) ABSTRACT

Provided is a manufacturing device of an aluminum nitride single crystal including a crucible. An aluminum nitride raw material and a seed crystal are stored in an inner portion of the crucible. The seed crystal is placed so as to face the aluminum nitride raw material. The crucible includes an inner crucible and an outer crucible. The inner crucible stores the aluminum nitride raw material and the seed crystal inside the inner crucible. The inner crucible is also corrosion resistant to a sublimation gas of the aluminum nitride raw material. The inner crucible includes either, a single body of a metal having an ion radius larger than an ion radius of an aluminum, or includes a nitride of the metal. The outer crucible includes a boron nitride. The outer crucible covers the inner crucible.

5 Claims, 2 Drawing Sheets

(56) References Cited

U.S. PATENT DOCUMENTS

| | | | |
|---|---|---|---|
| 5,954,874 A * | 9/1999 | Hunter | 117/84 |
| 6,045,612 A * | 4/2000 | Hunter | 117/84 |
| 6,296,956 B1 * | 10/2001 | Hunter | 428/698 |
| 6,770,135 B2 * | 8/2004 | Schowalter et al. | 117/106 |
| 7,011,804 B2 * | 3/2006 | Lau et al. | 423/412 |
| 7,217,403 B2 * | 5/2007 | Lai et al. | 423/412 |
| 7,332,027 B2 * | 2/2008 | Kobayashi et al. | 117/4 |
| 7,381,391 B2 * | 6/2008 | Spencer et al. | 423/290 |
| 7,553,373 B2 * | 6/2009 | Otsuki et al. | 117/109 |
| 7,553,469 B2 * | 6/2009 | Gotoh et al. | 423/412 |
| 7,678,195 B2 * | 3/2010 | Schlesser et al. | 117/94 |
| 8,303,942 B2 * | 11/2012 | Aimi et al. | 424/70.14 |
| 8,361,226 B2 * | 1/2013 | Miyanaga et al. | 117/86 |
| 2009/0013924 A1 * | 1/2009 | Iwai et al. | 117/64 |

FOREIGN PATENT DOCUMENTS

| | | |
|---|---|---|
| RU | 2158789 C1 | 11/2000 |
| WO | 2007/111219 A1 | 10/2007 |

OTHER PUBLICATIONS

Carsten Hartmann, et al., "Homoepitaxial seeding and growth of bulk AlN by sublimation", Journal of Crystal Growth, 2008, pp. 930-934, vol. 310.

Notice of Allowance issued by Russian Patent Office in Russian Application No. 2011142601 dated Nov. 28, 2012.

Edgar, J.H. et al, Impurity incorporation during the sublimation growth of aluminum nitride crystals, "AIChE Annual Meeting, Conference Proceedings", 2005, pp. 5387.

* cited by examiner

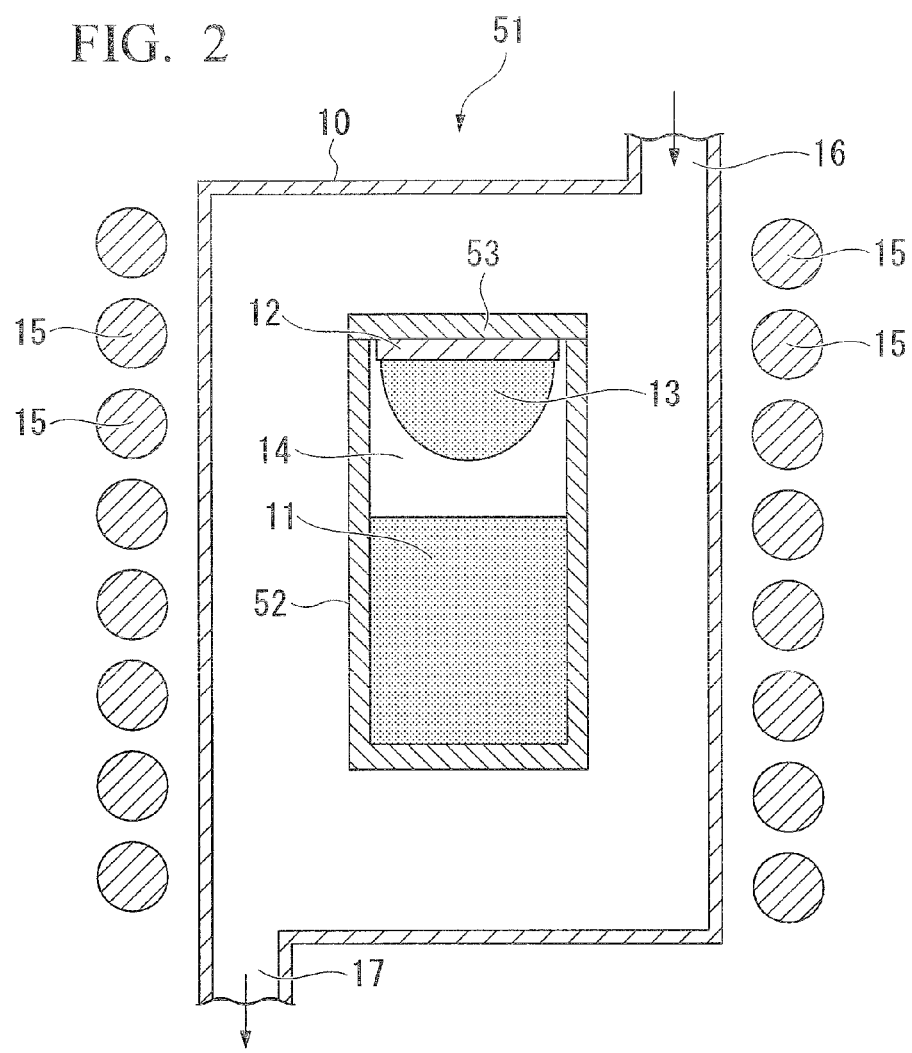

APPARATUS FOR MANUFACTURING ALUMINUM NITRIDE SINGLE CRYSTAL, METHOD FOR MANUFACTURING ALUMINUM NITRIDE SINGLE CRYSTAL, AND ALUMINUM NITRIDE SINGLE CRYSTAL

CROSS REFERENCE TO RELATED APPLICATIONS

This application is a continuation application based on a PCT Patent Application No. PCT/JP2010/002928, filed Apr. 22, 2010, whose priority is claimed on Japanese Patent Application No. 2009-106689 filed Apr. 24, 2009, the entire content of which is hereby incorporated by reference.

BACKGROUND OF THE INVENTION

1. Field of the Invention

The present invention relates to an apparatus for manufacturing aluminum nitride single crystal, method for manufacturing aluminum nitride single crystal, and aluminum nitride single crystal.

2. Description of the Related Art

An aluminum nitride single crystal type semiconductor has a band gap called 6 eV, which is extremely large among wide gap semiconductors. Thus, an aluminum nitride single crystal is regarded as very promising ingredient for ultra violet LEDs and laser elements. In addition, the grating constant of the aluminum nitride is extremely close to the grating constant of gallium nitride (GaN). Gallium nitride is expected to be a high-voltage high-frequency wave power device. Therefore, an aluminum nitride single crystal type semiconductor is highly regarded as an ingredient for a base member for manufacturing a GaN device.

Examples of manufacturing methods of an aluminum nitride in general include a liquid phase growth method (a flax method), a sublimation method (a sublimation recrystallization growth method), a hydride vapor phase deposition method (a gas phase growth method), and the like. Among these methods, the sublimation method is known as a method which allows a bulk crystal to be formed with a high crystal growth speed. The thickness of the bulk crystal is greater than or equal to a few millimeters. This sublimation method is widely known as a growth method of a single crystal of a carbonized silicon (SiC). Carbonized silicon is regarded as an ingredient of a next generation power semiconductor. Research and development have been performed for the growth of an aluminum nitride (AlN) single crystal by applying the sublimation method.

Here, a sublimation method for the growth of an aluminum nitride in general is described.

FIG. 2 shows an example of a manufacturing device 51 of an aluminum nitride single crystal in general. In FIG. 2, reference numeral 52 represents a crucible 52, reference numeral 53 represents a cap body 53, reference numeral 10 represents a crystal growth furnace, reference numeral 11 represents an aluminum nitride raw material, reference numeral 12 represents a seed crystal, reference numeral 13 represents an aluminum nitride single crystal, reference numeral 15 represents a heating device, reference numeral 16 represents a gas inlet, and reference numeral 17 represents a gas ejection unit.

The crucible 52 is a container created by graphite or tantalum carbide (TaC). An aluminum nitride raw material 11 is stored in the crucible 52. The cap body 53 is placed on an upper surface of the crucible 52. An inner space 14 is created by the cap body 53 and the crucible 52. At a lower surface of the cap body 53, a seed crystal 12 is fixed. The seed crystal 12 is created by an aluminum nitride or a silicon carbide (SiC).

The crucible 52 is fixed inside the crystal growth furnace 10. The crystal growth furnace 10 comprises the heating device 15. At a ceiling part of the crystal growth furnace 10, a gas inlet 16 is formed. The gas inlet 16 introduces nitrogen gas and the like inside the crystal growth furnace 10. At a bottom part of the crystal growth furnace 10, a gas ejection unit 17 is formed. The gas ejection unit 17 ejects gas which was introduced to an interior of the crystal growth furnace 10 such as nitrogen gas, or, gas which was generated at an interior of the crystal growth furnace 10. An interior of the crystal growth furnace 10 is adjusted to be at a predetermined gas pressure by the gas inlet 16 and the gas ejection unit 17.

When the aluminum nitride single crystal 13 is grown, a sublimation is performed by heating the aluminum nitride raw material 11 to approximately 2000° C. with the heating device 15. In this way, a sublimation gas with a composition of aluminum nitride is generated in the inner space 14. Then, the sublimation gas is transported to a location above the seed crystal 12. As a result, the aluminum nitride single crystal 13 is recrystallized above the seed crystal 12 due to the sublimation gas. At this time, in order to facilitate the transportation of the sublimation gas, the temperature of the seed crystal 12 is set to a temperature lower than the temperature of the aluminum nitride raw material 11.

As a sublimation method for manufacturing an aluminum nitride single crystal in general, methods indicated in E. N. Mokhov et al., Journal of Crystal Growth 281 (2005) 93 and C. Hartmann et al., Journal of Crystal Growth 310 (2008) 930 are known. According to these methods, a TaC crucible, a tungsten crucible, a boron nitride (BN) crucible, a graphite crucible, and a graphite crucible whose inner portion is coated with a nitride, are used as a crucible to store an aluminum nitride raw material. When a high-frequency wave heating furnace is used to manufacture an aluminum nitride single crystal, a graphite crucible is used as a heat generator of a heating furnace in general. In this case, an aluminum nitride single crystal is manufactured by placing a crucible for storing raw material inside the graphite crucible.

The sublimation gas generated by a heated aluminum nitride single crystal has a high corrosivity. In particular, a sublimation gas generated by an aluminum nitride single crystal heated to a temperature greater than or equal to 1900° C. has even higher corrosivity as the heating temperature increases. The TaC crucible is considered to be one of the crucibles having the strongest corrosion resistance against a sublimation gas of an aluminum nitride. In this way, it is possible to perform a crystal growth at a temperature greater than or equal to 2000° C. On the other hand, from an industrial standpoint, a crystal growth speed of greater than or equal to 100 μm/h is preferred in a bulk crystal growth. According to the growth of the aluminum nitride single crystal using the sublimation method, it is necessary that the temperature of the seed crystal be greater than or equal to 2000° C. in order to obtain a growth speed of greater than or equal to 100 μm/h. Therefore, the TaC crucible is one of the few crucibles suitable for bulk crystal growth. When this TaC crucible is used, it is possible to obtain an aluminum nitride bulk crystal having a thickness of greater than or equal to a few millimeters.

According to a crystal growth method using a crucible such as the sublimation method, a growing crystal is frequently contaminated as an impurity generated from the ingredients making up the crucible (hereinafter referred to as a crucible ingredient) blends with the growing crystal. In the case of a growth of an aluminum nitride single crystal according to the sublimation method using a TaC crucible, it is disclosed that a carbon of approximately several hundred ppm exists inside the aluminum nitride single crystal (See E. N. Mokhov et al., Journal of Crystal Growth 281 (2005) 93). In this way, when an aluminum nitride single crystal is grown using a crucible comprising a chemical compound comprising carbon (carbide), there is a possibility that carbon is blended inside the crystal inadvertently. Due to such blending of carbon, the phenomena described below are triggered, causing potentially serious problems.

(a) When carbon is blended inside the crystal as a carbon cluster, a crystal growth progresses with each carbon cluster being a nucleus. Thus, polycrystallization is triggered.

(b) Carbon blended into the crystal may become a cause for the generation of a carrier affecting electric conductivity. As a result, a concentration is obtained which is different from a predetermined carrier concentration.

(c) Carbon blended into the crystal generates a lattice defect in the surroundings. As a result, the quality of the crystal is deteriorated.

In fact, a aluminum nitride single crystal obtained by the crystal growth using the TaC crucible described above has a full width at half maximum (FWHM) of greater than or equal to 100 arcsec at a (0002) reflection at an X-ray diffraction locking curve. In this way, the crystallization properties of the aluminum nitride single crystal is not good.

Even when a crucible is used made up of non-carbide type ingredient such as tungsten and the like, there may be instances in which carbon blends with the aluminum nitride single crystal. For example, when a graphite ingredient is placed around the crucible as a heater, the crucible ingredient and a carbon isolated from the heater react with one another in an environment with a temperature greater than or equal to 2000° C. in which crystal growth is performed. As a result, the non-carbide type crucible ingredient is altered to a carbide while the crystal is growing. As a result, similar to the crystal growth using the TaC crucible, there is a possibility that carbon is blended into the aluminum nitride single crystal.

On the other hand, from an industrial standpoint, a crystal growth speed of greater than or equal to 100 μm/h is necessary. Therefore, it is necessary that the temperature of the seed crystal be greater than or equal to 2000° C. However, a TaC crucible and a tungsten crucible are the only crucibles reported to be resistant to the corrosion due to the sublimation gas of the aluminum nitride at a temperature greater than or equal to 2000° C.

The present invention is made in light of these problems. An object of the present invention is to provide an apparatus for manufacturing an aluminum nitride single crystal, which has superior corrosion resistance against a sublimation gas of an aluminum nitride generated while manufacturing an aluminum nitride single crystal, and which can achieve an aluminum nitride single crystal growth velocity of greater than or equal to 100 μm/h.

SUMMARY

In order to resolve the above problems, the present invention employs the following measures.

(1) A manufacturing device of an aluminum nitride single crystal includes a crucible. An aluminum nitride raw material and a seed crystal are stored in an inner portion of the crucible. The seed crystal is placed so as to face the aluminum nitride raw material. The crucible includes an inner crucible and an outer crucible. The inner crucible stores the aluminum nitride raw material and the seed crystal inside the inner crucible. The inner crucible is also corrosion resistant to a sublimation gas of the aluminum nitride raw material. The inner crucible includes either, a single body of a metal having an ion radius larger than an ion radius of an aluminum, or includes a nitride of the metal. The outer crucible includes a boron nitride. The outer crucible covers the inner crucible.

(2) It is preferred that the above manufacturing device of an aluminum nitride single crystal according to (1) be configured as follows: the ion radius of the metal is greater than or equal to 1.3 times the ion radius of the aluminum.

(3) It is preferred that the above manufacturing device of an aluminum nitride single crystal according to (2) be configured as follows: the ion radius of the metal is greater than or equal to 1.37 times the ion radius of the aluminum and is less than or equal to 1.85 times the ion radius of the aluminum.

(4) It is preferred that the above manufacturing device of an aluminum nitride single crystal according to (3) be configured as follows: the inner crucible includes at least one type of a molybdenum, a tungsten, a tantalum, a molybdenum nitride, a zirconium nitride, a tungsten nitride, and a tantalum nitride.

(5) It is preferred that the above manufacturing device of an aluminum nitride single crystal according to (1) be configured as follows: the crucible further includes a graphite crucible covering the outer crucible.

(6) In addition, an aluminum nitride single crystal obtained by using the manufacturing device of an aluminum nitride single crystal according to (1) is such that a concentration of a carbon inside the aluminum nitride single crystal is less than or equal to 100 ppm.

(7) It is preferred that the above aluminum nitride single crystal according to (6) be configured as follows: the concentration of the carbon is less than or equal to 10 ppm.

(8) In addition, a method of manufacturing an aluminum nitride single crystal by growing an aluminum nitride single crystal on a seed crystal using a manufacturing device of an aluminum nitride single crystal includes a step making an interior of the inner crucible an atmosphere of a nitrogen gas; a step heating the crucible; and a step reducing a pressure inside the inner crucible. The manufacturing device of an aluminum nitride single crystal includes a crucible. The crucible includes an inner crucible and an outer crucible. The inner crucible stores an aluminum nitride raw material and the seed crystal inside the inner crucible. An aluminum nitride raw material and a seed crystal are stored in an inner portion of the crucible. The aluminum nitride raw material and the seed crystal are stored inside the inner crucible so as to face one another. The inner crucible includes either, a single body of a metal having an ion radius larger than an ion radius of an aluminum, or includes a nitride of the metal. The outer crucible includes a boron nitride. The outer crucible covers the inner crucible.

(9) It is preferred that the above method of manufacturing an aluminum nitride single crystal according to (8) be configured as follows: the inner crucible includes at least one type of a molybdenum, a tungsten, a tantalum, a molybdenum nitride, a zirconium nitride, a tungsten nitride, and a tantalum nitride.

(10) It is preferred that the above method of manufacturing an aluminum nitride single crystal according to (8) be configured as follows: a graphite crucible is further provided to cover the outer crucible and to manufacture the aluminum nitride single crystal.

(11) It is preferred that the above method of manufacturing an aluminum nitride single crystal according to (8) be configured as follows: when the crucible is heated, the crucible is heated so that a temperature of the seed crystal and a temperature of the aluminum nitride raw material become 1700-2300° C.

According to an apparatus for manufacturing an aluminum nitride single crystal described in (1) above, a crucible is a two-layered structure. An inner crucible has corrosion resistance against a sublimation gas of an aluminum nitride. At the same time, the inner crucible is made of a single body of a metal having an ion radius greater than an ion radius of aluminum, or a nitride of such metal. Therefore, the inner crucible is resistant to corrosion by a sublimation gas of an aluminum nitride at a temperature greater than or equal to 2000° C. As a result, it is possible to achieve an aluminum nitride single crystal growth speed of greater than or equal to 100 µm/h.

Furthermore, according to an apparatus for manufacturing an aluminum nitride single crystal described in (1) above, a crucible is a two-layered structure. An outer crucible is made of boron nitride. Therefore, as described in (5) above, even when a graphite crucible is placed outside of the outer crucible, carbon from the graphite crucible is prevented from entering the inner crucible and from being blended into the aluminum nitride single crystal. As a result, the concentration of carbon inside the aluminum nitride single crystal may be restrained to less than or equal to 100 ppm.

BRIEF DESCRIPTION OF THE DRAWINGS

FIG. 2 is a skeletal structural diagram showing a conventional apparatus for manufacturing an aluminum nitride single crystal.

DETAILED DESCRIPTION OF THE PREFERRED EMBODIMENTS

Figure 1:
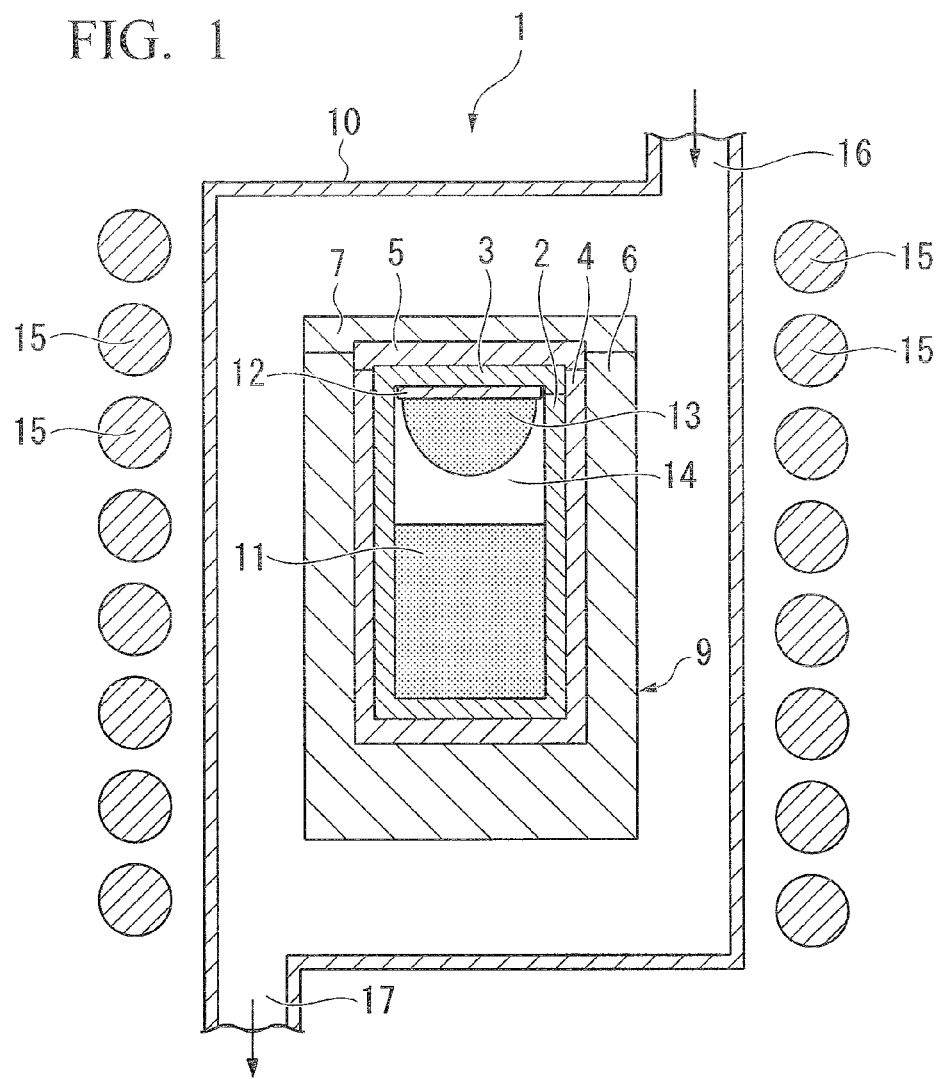
FIG. 1 is a skeletal structural diagram showing an apparatus for manufacturing an aluminum nitride single crystal according to an aspect of the present invention.

Hereinafter, an embodiment of the present invention is described with reference to the diagrams. FIG. 1 is a skeletal structural diagram showing an apparatus for manufacturing an aluminum nitride single crystal according to a first embodiment of the present invention. A manufacturing device 1 of the aluminum nitride single crystal sublimates and re-crystallizes the aluminum nitride on the seed crystal using a sublimation re-crystallization method. The manufacturing device 1 thus makes the aluminum nitride single crystal grow.

Similar to a general crystal manufacturing device, the manufacturing device 1 of the aluminum nitride single crystal comprises, for example, a crucible 9, a crystal growth furnace 10, a seed crystal 12, a gas inlet 16, a gas ejection unit 17, a heating device 15, a drying pump not diagrammed, and a vacuum pumping device such as a turbo-molecule pump and the like.

According to the manufacturing device 1 of the aluminum nitride single crystal according to the present embodiment, the crucible 9 has a three-layered structure. The crucible 9, having a three-layered structure, comprises an inner crucible 2 (and an upper lid 3), an outer crucible 4 (and a lid body 5) placed outside the inner crucible 2, and a graphite crucible 6 (and a graphite lid body 7) placed outside the outer crucible 4. The aluminum nitride raw material 11 is contained inside the inner crucible 2. The seed crystal 12 is fixed to a lower surface of the upper lid 3 mounted on an upper portion of the inner crucible 2.

First, amount the crucible 9 with a three-layered structure, the inner crucible 2 is described. The inner crucible 2 is positioned at an innermost side.

An upper lid 3 is mounted on an upper surface of the inner crucible 2. As a result, an inner space 14 is formed in the inner crucible 2. The inner space 14 is a semi-sealed space. The inner space 14 is configured so that gas may be ejected and introduced to and from an exterior portion.

As described above, the aluminum nitride raw material 11 is stored in the inner crucible 2. A seed crystal 12 for crystal growth is fixed to a lower surface of the upper lid 3 so as to face the aluminum nitride raw material 11. This seed crystal 12 may be, for example, a 6H—SiC single crystal plate.

The inner crucible 2 and the upper lid 3 are made of a single body of a metal having an ion radius greater than an ion radius of aluminum, or a nitride of such metal. For example, it is preferable that the ion radius of the metal be greater than or equal to 1.3 times the ion radius (four-coordinated) of aluminum. It is even more preferable when the ion radius of the metal is greater than or equal to 1.37 times the ion radius (four-coordinated) of aluminum and is less than or equal to 1.85 times the ion radius (four-coordinated) of aluminum. Examples of such substances include molybdenum, tungsten, and tantalum. According to these substances, the ion radius in a six-coordinated instance is greater than or equal to 1.3 times the ion radius of aluminum in a four-coordinated instance (53 pm). In further detail, the ion radius of molybdenum in a six-coordinated instance is 73 pm, the ion radius of tungsten in a six-coordinated instance is 78 pm, the ion radius of tantalum is 78 pm. (See R. D. Shannon, Acta Cryst. (1976) A32 751.) Hence, these ion radii are greater than or equal to 1.3 times the ion radius of aluminum in a four-coordinated instance of 53 pm. In further detail, these ion radii are greater than or equal to 1.37 times the radius (the ion radius 73 pm of molybdenum/the ion radius 53 pm of aluminum). In addition, the nitrides of these substances are molybdenum nitride, tungsten nitride, and tantalum nitride. Further, it is possible to use zirconium nitride. The ion radius of zirconium (86 pm in a six-coordinated instance, and 98 pm in an eight-coordinated instance) is also greater than the ion radius of aluminum (in a four-coordinated instance) and is greater than or equal to 1.3 times the ion radius of aluminum. Furthermore, the number 1.85 was calculated as follows: (the ion radius 98 pm of zirconium in an eight-coordinated instance)/(the ion radius 53 pm of aluminum in a four-coordinated instance). The ingredient for the inner crucible 2 and the upper lid 3 is selected from one type among these substances. The justification is described below.

An aluminum nitride raw material 11 is directly stored in the inner crucible 2. At the same time, the seed crystal 12 is fixed to the upper lid 3. When the aluminum nitride single crystal is growing, the inner crucible 2 and the upper lid 3 are exposed to a sublimation gas of aluminum nitride suitable for bulk crystal growth. Therefore, the inner crucible 2 and the upper lid 3 must be resistant to the corrosion due to the sublimation gas of aluminum nitride. In addition, in order to prevent the ingredient of the inner crucible 2 and the upper lid 3 from contaminating the aluminum nitride single crystal 13 (contamination due to solid solution), it is preferable that the ingredient of the inner crucible 2 and the upper lid 3 be a single body of a metal having an ion radius greater than (greater than or equal to 1.3 times) an ion radius of aluminum, or a nitride of such metal. By using a metal having an ion radius of greater than or equal to 1.3 times the ion radius of aluminum, it is possible to prevent the metal from being replaced with a portion of aluminum of the aluminum nitride and from a solid solution being formed. In the present Specification, the ion radius of molybdenum is presented in a six-coordinated instance, the ion radius of tungsten is presented in a six-coordinated instance, and the ion radius of tantalum is presented in a six-coordinated instance, and the ion radius of tungsten is presented in a six-coordinated or eight-coordinated instance. This is because, when these metal are replaced with aluminum and a solid solution is formed, each of the metal element and the nitrogen element are positioned in the coordinated instances described above. Incidentally, in a crystal of an aluminum nitride, the aluminum element and the nitrogen element are usually placed in a four-coordinated position.

When an oxide is as the inner crucible 2 and the upper lid 3, a layer of aluminum oxynitride (AlON) is formed in the aluminum nitride single crystal due to oxygen being ejected from the oxide due to heat. This layer of AlON obstructs the growth of the aluminum nitride crystal. Therefore, an oxide cannot be used as the inner crucible 2 and the upper lid 3. Furthermore, when a boride is used as the inner crucible 2 and the upper lid 3, the aluminum nitride is contaminated with boron at a temperature greater than or equal to 1950° C. Therefore, a boride is also unsuitable as the inner crucible 2 and the upper lid 3.

Due to the conditions described above, the inner crucible 2 and the upper lid 3 comprise one type from among the following: molybdenum, tungsten, tantalum, molybdenum nitride, zirconium nitride, tungsten nitride, and tantalum nitride. The aluminum nitride raw material 11 is directly stored in the inner crucible 2 and the upper lid 3.

Next, the outer crucible 4 is described. The outer crucible 4 is placed between the inner crucible 2 and the graphite crucible 6.

The outer crucible 4 is large enough to store the inner crucible 2 and to cover the inner crucible 2. The outer crucible 4 is placed so as to be approximately adhered to the peripheral surface of the inner crucible 2 and the upper lid 3. The lid body 5 is mounted on an upper surface of the outer crucible 4.

The outer crucible 4 is made of boron nitride (BN). The justification is described below.

The graphite crucible 6 is placed at an outermost layer among the crucible 9 having a three-layered structure according to the present embodiment. This graphite crucible 6 is used as a heat generator. However, when the aluminum nitride single crystal is undergoing a crystal growth, carbon is sometimes isolated from the graphite portion making up the graphite crucible 6, and is sometimes blended into the aluminum nitride single crystal 13. In order to prevent this phenomenon, it is first necessary to prevent carbon contamination to the upper lid 3 and the inner crucible 2 which are each in contact with the aluminum nitride single crystal 13 and the aluminum nitride raw material 11 or are facing the aluminum nitride single crystal 13 and the aluminum nitride raw material 11. Thus, it is necessary to cover the outer side of the inner crucible 2 and the upper lid 3 with a material which can shut out carbon. A material which can shut out carbon refers to, in this instance, an ingredient which does not react with carbon at a temperature greater than or equal to 2000° C. when the crystal growth is performed. Boron nitride (BN) is the most suitable ingredient which satisfies these conditions.

Meanwhile, boron nitride has the following problems.

(a) Boron nitride has a low corrosion resistance against the sublimation gas of aluminum nitride. Therefore, when the upper lid and the crucible, which directly stores the aluminum nitride raw material 11, are made with boron nitride, it is impossible to perform a bulk crystal growth of aluminum nitride at a temperature greater than or equal to 2000° C.

(b) Boron nitride is a boride. Therefore, when boron nitride is in contact with the aluminum nitride raw material 11 and the aluminum nitride single crystal 13, boron blends into aluminum nitride at a temperature greater than or equal to 1950° C. as described above.

Hence, boron nitride is used particularly for shutting out carbon. Boron nitride is not used as the inner crucible 2 or the upper lid 3, which directly contact or face the aluminum nitride single crystal 13 and the aluminum nitride raw material 11.

The graphite crucible 6 is fixed to the crystal growth furnace 10 with a predetermined method.

The graphite lid body 7 is mounted on (or simply fitted to) an upper surface of the opening of the graphite crucible 6. Therefore, the graphite crucible 7 is a semi-sealed structure so that nitrogen gas may easily enter and exit. The relation between the upper lid 3, the inner crucible 2, the lid body 5, and the outer crucible is also similar. Nitrogen gas is introduced from the gas inlet 16. As a result, nitrogen gas may flow into the inner space 14. In addition, the crystal growth furnace 10 is configured so that the pressure of the interior of the crystal growth furnace 10 may be reduced by using a vacuum pumping device which is not diagrammed.

Next, a manufacturing method of an aluminum nitride single crystal using a manufacturing device of an aluminum nitride single crystal configured as described above is described.

First, the aluminum nitride raw material 11 is stored in the inner crucible 2. The seed crystal 12 is fixed to a lower surface of the upper lid 3. The aluminum nitride raw material 11 and the seed crystal 12 are placed so as to face one another.

Usually, an aluminum nitride powder is used as the aluminum nitride raw material 11. An SiC single crystal, an AlN single crystal, or an AlN/SiC single crystal is used as the seed crystal 12. The AlN/SiC single crystal is obtained by performing a hetero growth of an AlN single crystal film with a film thickness of approximately 200 to 500 μm on an AlN single crystal.

Regarding the growth of the aluminum nitride single crystal, first, a vacuum pumping device is operated. This vacuum pumping device is not diagrammed. Atmosphere inside the crystal growth furnace 10 is removed. Thus, the pressure inside the crystal growth furnace 10 is reduced. Next, nitrogen gas is introduced to the crystal growth furnace 10 from the gas inlet 16. Thus, the growth of the aluminum nitride single crystal is performed in an atmosphere with high purity nitrogen gas. Nitrogen gas introduced to the crystal growth furnace 10 is ejected from the gas ejection unit 17.

Next, the crucible 9 is heated with a heating device 15 such as a high frequency wave furnace, a resistance heating furnace, an infrared furnace, and the like. In this instance, the heating temperature is controlled by using a radiation thermometer to measure the temperature of an upper end of the crucible 9 (the temperature of the seed crystal 12) and the temperature of a lower end of the crucible 9 (the temperature of the aluminum nitride raw material 11). At this time, the temperature of the seed crystal 12 and the temperature of the aluminum nitride raw material 11 are controlled to be 1700° C. to 2300° C.

The growth of the aluminum nitride single crystal begins by reducing the pressure inside the crystal growth furnace 10 after the temperature of the seed crystal 12 and the temperature of the aluminum nitride raw material 11 are increased to the temperature described above. At this time, the pressure inside the crystal growth furnace 10 is reduced to 100 to 600 torr. This pressure is maintained. The growth of the crystal is performed under the above conditions using the manufacturing device 1 of the aluminum nitride single crystal. As a result, an aluminum nitride single crystal 13 grows on the seed crystal 12.

According to a manufacturing device of an aluminum nitride single crystal based on the present embodiment, the crucible 9 has a three-layered structure. An inner crucible 2 made with tantalum and the like is placed. As a result, the crucible 9 and the manufacturing device can resist the corrosion due to the sublimation gas of the aluminum nitride with a temperature greater than or equal to 2000° C. As a result, it is possible to achieve a growth velocity of aluminum nitride single crystal of greater than or equal to 100 μm/h.

Further, according to the manufacturing device of the aluminum nitride based on the present embodiment, the crucible 9 is a three-layered structure. Further, an outer crucible 4 made of boron nitride is placed. As a result, it is possible to prevent carbon from entering the inner crucible 2 from outside. Thus, it is possible to restrain the concentration of carbon inside the aluminum nitride single crystal manufactured by this manufacturing device to less than or equal to 100 ppm.

WORKING EXAMPLES

Hereinafter, the present invention is described in further detail according to specific working examples. However, the present invention is not limited by these working examples.

Working Example 1

Using a manufacturing device for manufacturing an aluminum nitride single crystal shown in FIG. 1, an aluminum nitride single crystal was grown on a seed crystal 12. The ingredients of the crucible are such that the inner crucible 2 is made of tantalum, while the outer crucible 4 is made of boron nitride. A graphite crucible was placed on an outermost side of the crucible. As a seed crystal 12, an 6H—SiC single crystal (having a diameter of 48 mm and a thickness of 600 μm) was used. The 6H—SiC is shaped as a disc. A (0001) Si surface and a C surface were the growth surface of the crystal.

The crucible 9 was placed inside the crystal growth furnace 10. Thereafter, a turbo molecule pump and a drying pump, not diagrammed, were successively operated. Thus, air inside the crystal growth furnace 10 was removed, and the pressure inside the crystal growth furnace 10 was reduced to $5 \times 10^{-6}$ torr. Then, nitrogen gas was introduced into the crystal growth furnace 10 from the gas inlet 16, and the pressure was increased to 700 torr. Next, the temperature of the seed crystal 12 was increased to 1700-2000° C. Then, the growth of the aluminum nitride single crystal was started by reducing the pressure inside the crystal growth furnace 10 to 100-600 torr.

When 10-120 hours have passed since crystal growth was started, the pressure inside the crystal growth furnace 10 was increased to 700 torr with nitrogen gas. Thereafter, the crystal growth was terminated by cooling the seed crystal 12 and the aluminum nitride raw material 11 to room temperature.

The size of the aluminum nitride single crystal 13 which was obtained was such that the diameter equals 48 mm and the thickness equals 0.1-4 mm. The crystal growth speed was 10-130 μm/h.

A sample for evaluation was made by cutting the aluminum nitride single crystal 13 in a vertical and parallel direction with respect to the direction of the crystal growth, thus forming a board-like sample with a thickness of 1 mm. The surface of the sample for evaluation was polished so that the surface became a flat mirror surface. In this way, damage due to processing was removed from the surface. The evaluation was made by identifying the phase with a Raman scatter measurement, and by examining crystalline properties with a full width at half maximum (FWHM) measurement with respect to an x-ray diffraction locking curve. Further, the carbon concentration inside the crystal was measured with a secondary ion mass spectrometry (SIMS).

From the Raman scatter measurement, it was determined that the phase of the obtained crystal was aluminum nitride. Further, the FWHM of a (0002) reflection of the x-ray diffraction was 40 arcsec. From the secondary ion mass spectrometry, the carbon concentration of the obtained crystal was less than or equal to 10 ppm. These values are small compared to the values reported in regards to aluminum nitride single crystal growth obtained by the conventional sublimation method. This indicates that the aluminum nitride single crystal obtained according to the present invention is an aluminum nitride single crystal with a low carbon concentration having superior crystalline properties.

Working Example 2

Using a manufacturing device for manufacturing an aluminum nitride single crystal shown in FIG. 1, an aluminum nitride single crystal was grown on a seed crystal 12. The ingredients of the crucible are such that the inner crucible 2 is made of tantalum, while the outer crucible 4 is made of boron nitride. A graphite crucible was placed on an outermost side of the crucible. As a seed crystal 12, an AlN/SiC single crystal (having a diameter of 48 mm and a thickness of 2 mm) was used. The AlN/SiC is shaped as a disc. A single crystal obtained in Working Example 1 was used as this AlN/SiC single crystal.

The crucible 9 was placed inside the crystal growth furnace 10. Thereafter, a turbo molecule pump and a drying pump, not diagrammed, were successively operated. Thus, air inside the crystal growth furnace 10 was removed, and the pressure inside the crystal growth furnace 10 was reduced to $5 \times 10^{-6}$ torr. Then, nitrogen gas was introduced into the crystal growth furnace 10 from the gas inlet 16, and the pressure was increased to 700 torr. Next, the temperature of the seed crystal 12 was increased to 2000-2200° C. Then, the growth of the aluminum nitride single crystal was started by reducing the pressure inside the crystal growth furnace 10 to 100-600 torr.

When 10-70 hours have passed since crystal growth was started, the pressure inside the crystal growth furnace 10 was increased to 700 torr with nitrogen gas. Thereafter, the crystal growth was terminated by cooling the seed crystal 12 and the aluminum nitride raw material 11 to room temperature. The size of the aluminum nitride single crystal 13 which was obtained was such that the diameter equals 48 mm and the thickness equals 9-17 mm. The crystal growth speed was 130-500 μm/h.

A sample for evaluation was made by cutting the aluminum nitride single crystal 13 in a vertical and parallel direction with respect to the direction of the crystal growth, thus forming a board-like sample with a thickness of 1 mm. The surface of the sample for evaluation was polished so that the surface became a flat mirror surface. In this way, damage due to processing was removed from the surface. Using methods similar to those described in Working Example 1, the concentration of oxygen and the like included in the aluminum nitride single crystal was measured.

From the Raman scatter measurement, it was determined that the phase of the obtained crystal was aluminum nitride. Further, the FWHM of a (0002) reflection of the x-ray diffraction was 20 arcsec. From the secondary ion mass spectrometry, the carbon concentration inside the obtained crystal was 30-50 ppm. These values are small compared to the values reported in regards to aluminum nitride single crystal growth obtained by the conventional sublimation method. This indicates that the aluminum nitride single crystal obtained according to the present invention is an aluminum nitride single crystal with a low carbon concentration having superior crystalline properties.

Working Example 3

Using a manufacturing device 1 for manufacturing an aluminum nitride single crystal shown in FIG. 1, an aluminum nitride single crystal was grown on a seed crystal 12. The ingredients of the crucible are such that the inner crucible 2 is made of tantalum, while the outer crucible 4 is made of boron nitride. A graphite crucible was placed on an outermost side of the crucible. As a seed crystal 12, an aluminum nitride single crystal (having a diameter of 48 mm and a thickness of 1 mm) was used. The aluminum nitride single crystal was created by a method described below.

A single crystal of the aluminum nitride crystal obtained in Working Example 2 was cut in a parallel direction with respect to the direction of the crystal growth, thus forming a board-like single crystal with a thickness of 1 mm. The surface of the board-like single crystal was polished so that the surface became a flat mirror surface. In this way, damage due to processing was removed from the surface. This board-like single crystal of aluminum nitride was used as the seed crystal 12 in Working Example 3.

The crucible 9 was placed inside the crystal growth furnace 10. Thereafter, a turbo molecule pump and a drying pump, not diagrammed, were successively operated. Thus, air inside the crystal growth furnace 10 was removed, and the pressure inside the crystal growth furnace 10 was reduced to $5 \times 10^{-6}$ torr. Then, nitrogen gas was introduced into the crystal growth furnace 10 from the gas inlet 16, and the pressure was increased to 700 torr. Next, the temperature of the seed crystal 12 was increased to 2000-2200° C. Then, the growth of the aluminum nitride single crystal was started by reducing the pressure inside the crystal growth furnace 10 to 100-600 torr.

When 30-100 hours have passed since crystal growth was started, the pressure inside the crystal growth furnace 10 was increased to 700 torr with nitrogen gas. Thereafter, the crystal growth was terminated by cooling the seed crystal 12 and the aluminum nitride raw material 11 to room temperature. The size of the aluminum nitride single crystal 13 which was obtained was such that the diameter equals 48 mm and the thickness equals 15-40 mm. The crystal growth speed was 130-500 μm/h.

A sample for evaluation was made by cutting the aluminum nitride single crystal 13 in a vertical and parallel direction with respect to the direction of the crystal growth, thus forming a board-like sample with a thickness of 1 mm. The surface of the sample for evaluation was polished so that the surface became a flat mirror surface. In this way, damage due to processing was removed from the surface. Using methods similar to those described in Working Examples 1 and 2, the concentration of oxygen and the like included in the crystal was measured. From the Raman scatter measurement, it was determined that the phase of the obtained crystal was aluminum nitride. The FWHM of a (0002) reflection of the x-ray diffraction was 10 arcsec. From the secondary ion mass spectrometry, the carbon concentration inside the obtained crystal was 50-70 ppm. These values are small compared to the values reported in regards to aluminum nitride single crystal growth obtained by the conventional sublimation method. This indicates that the aluminum nitride single crystal obtained according to the present invention is an aluminum nitride single crystal with a low carbon concentration having superior crystalline properties.

Table 1 shows a summary of the primary experimentation conditions and results according to Working Examples 1-3.

Comparative Example

A growth of an aluminum nitride single crystal was performed similar to Working Example 1. The differences between the present Comparative Example and the Working Example 1 are that the crucible comprises a crucible comprising TaC and a graphite crucible covering the exterior side of this crucible comprising TaC, and that the growth of the crystal was performed for 100 hours. The size of the aluminum nitride single crystal 13 which was obtained was such that the diameter equals 48 mm and the thickness equals 12 mm. The crystal growth speed was 120 μm/h.

Regarding the obtained aluminum nitride single crystal, an evaluation was made similar to Working Example 1 by identifying the phase with a Raman scatter measurement, and by examining crystalline properties with a full width at half maximum (FWHM) measurement with respect to an x-ray diffraction locking curve. Further, the carbon concentration inside the crystal was measured with a secondary ion mass spectrometry (SIMS).

From the Raman scatter measurement, it was determined that the phase of the obtained crystal was aluminum nitride. Further, the FWHM of a (0002) reflection of the x-ray diffraction was 35 arcsec. From the secondary ion mass spectrometry, the carbon concentration of the obtained crystal was greater than or equal to 150 ppm. In this way, according to this Comparative Example in which an aluminum nitride single crystal is manufactured using a crucible configured similar to conventional configurations, a greater amount of carbon was mixed into the aluminum nitride single crystal compared to Working Examples 1-3.

Table 1 also shows a summary of the primary experimentation conditions and results according to this Comparative Example.

TABLE 1

| | Seed Crystal | Seed Crystal Temperature (° C.) | Growth Time (h) | Carbon Concentration of Grown AlN Crystal (ppm) | Size of Grown AlN Crystal |
|---|---|---|---|---|---|
| Working Example 1 | SiC φ 48 mm | 1700-2000 | 10-120 | <10 | φ 48 mm Thickness 0.1-4 mm |
| Working Example 2 | AlN/SiC φ 48 mm | 2000-2200 | 10-70 | 30-50 | φ 48 mm Thickness 9-17 mm |

TABLE 1-continued

|  | Seed Crystal | Seed Crystal Temperature (° C.) | Growth Time (h) | Carbon Concentration of Grown AlN Crystal (ppm) | Size of Grown AlN Crystal |
|---|---|---|---|---|---|
| Working Example 3 | AlN/SiC φ 48 mm | 2000-2200 | 30-100 | 50-70 | φ 48 mm Thickness 15-40 mm |
| Comparative Example | SiC φ 48 mm | 1700-2000 | 100 | ≥150 | φ 48 mm Thickness 12 mm |

Table 1 shows that, according to the manufacturing device for manufacturing an aluminum nitride single crystal using a crucible with a three-layered structure based on the present invention, a corrosion of the crucible 9 did not occur. Moreover, a growth speed of greater than or equal to 100 μm/h was obtained by having the temperature of the seed crystal in particular be greater than or equal to 2000° C. Furthermore, the carbon concentration inside the crystal which was formed became less than or equal to 100 ppm. Due to these characteristics, a large aluminum nitride bulk crystal is obtained. This large aluminum nitride bulk crystal is clear, colorless, and has high crystalline properties.

As shown in Table 1, according to the present invention, when the temperature of the seed crystal is 1700-2000° C., and a growth of the aluminum nitride single crystal is performed, the crystal growth speed declines. However, it is possible to manufacture an aluminum nitride single crystal with a high level of purity (the carbon concentration inside the crystal being less than or equal to 10 ppm). Meanwhile, by having the temperature of the seed crystal be greater than or equal to 2000° C., it is possible to manufacture an aluminum nitride single crystal with a carbon concentration inside the crystal being less than or equal to 100 ppm, at a crystal growth speed of greater than or equal to 100 μm/h. Therefore, the temperature during manufacturing may be adjusted appropriately according to the required manufacturing speed and the purity of the aluminum nitride single crystal.

According to the working examples, a sublimation method was used to manufacture an aluminum nitride single crystal. However, the present invention is not limited to this method. It is possible to use, as appropriate, a liquid phase growth method (a flax method), a hydride vapor phase deposition method (a gas phase growth method), and the like.

According to the working examples, a configuration was made such that an inner crucible is made of tantalum, an outer crucible is made of boron nitride, and a graphite crucible is positioned at a further outer side. However, a configuration of a crucible with a two-layered structure is possible such that, a graphite crucible is not placed, and an outer crucible 4 is directly heated. According to this configuration, it is possible to obtain effects similar to those obtained in the Working Examples.

The technical scope of the present invention is not limited by the embodiments described above. Various alterations may be made within the gist of the present inventions.

According to an apparatus for manufacturing an aluminum nitride single crystal, it is possible to achieve a resistance against corrosion due to a sublimation gas of aluminum nitride with a temperature of greater than or equal to 2000° C. At the same time, it is possible to achieve an aluminum nitride single crystal growth speed of greater than or equal to 100 μm/h. Further, it is possible to lower the carbon concentration inside the aluminum nitride single crystal which was manufactured (to be less than or equal to 100 ppm).

What is claimed is:

1. A manufacturing device of an aluminum nitride single crystal, the manufacturing device comprising a crucible, the crucible storing in an inner portion of the crucible, an aluminum nitride raw material and a seed crystal placed so as to face the aluminum nitride raw material, wherein
the crucible comprises:
an inner crucible, the inner crucible storing the aluminum nitride raw material and the seed crystal inside the inner crucible, the inner crucible also being corrosion resistant to a sublimation gas of the aluminum nitride raw material, and the inner crucible comprising a single body of a metal having an ion radius larger than an ion radius of an aluminum or a nitride of the metal;
an upper lid mounted on an upper surface of the inner crucible, the upper lid comprising a single body of a metal having an ion radius larger than an ion radius of an aluminum or a nitride of the metal; and
an outer crucible, the outer crucible comprising a boron nitride, the outer crucible also covering the inner crucible; and
a lid body mounted on an upper surface of the outer crucible, the lid body comprising a boron nitride, wherein,
the outer crucible is placed so as to adhered to a peripheral surface of the inner crucible and the upper lid, and the lid body is placed so as to be adhered to an upper surface of the upper lid.

2. The manufacturing device of an aluminum nitride single crystal according to claim 1, wherein the ion radius of the metal is greater than or equal to 1.3 times the ion radius of the aluminum.

3. The manufacturing device of an aluminum nitride single crystal according to claim 2, wherein the ion radius of the metal is greater than or equal to 1.37 times the ion radius of the aluminum and is less than or equal to 1.85 times the ion radius of the aluminum.

4. The manufacturing device of an aluminum nitride single crystal according to claim 3, wherein the inner crucible and the upper lid comprise at least one type of a molybdenum, a tungsten, a tantalum, a molybdenum nitride, a zirconium nitride, a tungsten nitride, and a tantalum nitride.

5. The manufacturing device of an aluminum nitride single crystal according to claim 1, wherein the crucible further comprises a graphite crucible covering the outer crucible.

* * * * *